United States Patent [19]
Sullivan

[11] Patent Number: 6,148,188
[45] Date of Patent: *Nov. 14, 2000

[54] DYNAMIC TEMPERATURE MEASUREMENT

[76] Inventor: William B. Sullivan, c/o Wide Band Systems, Inc., 389 Franklin Ave., Rockaway, N.J. 07866-0289

[*] Notice: This patent is subject to a terminal disclaimer.

[21] Appl. No.: 09/201,215

[22] Filed: Nov. 30, 1998

Related U.S. Application Data

[63] Continuation of application No. 08/786,127, Jan. 17, 1997.

[51] Int. Cl.$^7$ ..................................................... H04B 17/00
[52] U.S. Cl. ...................................... 455/226.1; 455/67.1
[58] Field of Search ............................... 455/226.1, 67.1, 455/115, 103; 374/183, 141; 327/262, 513

[56] References Cited

U.S. PATENT DOCUMENTS

| | | | |
|---|---|---|---|
| 5,230,076 | 7/1993 | Wilkinson | 455/226.1 |
| 5,483,676 | 1/1996 | Mahany et al. | 455/67.4 |
| 5,812,947 | 9/1998 | Dent | 455/103 |
| 5,913,158 | 6/1999 | Sullivan | 455/226.1 |

Primary Examiner—Nguyen Vo
Assistant Examiner—Greta J. Fuller
Attorney, Agent, or Firm—Zachary T. Wobensmith, III

[57] ABSTRACT

An arrangement for accurately measuring the frequency of an RF signal is disclosed. The arrangement includes a coaxial delay line carrying the RF signal and a means for directly measuring the resistance of the coaxial delay line and which resistance measurement is directly correlatable to temperature changes of the coaxial delay line. The arrangement, in response to the changes in the temperature of the coaxial delay line, provides appropriate signals to compensate for the temperature changes in order to prevent any temperature changes from degrading the accuracy of the frequency measured by the arrangement.

6 Claims, 10 Drawing Sheets

DYNAMIC TEMPERATURE MEASUREMENT

CROSS-REFERENCE TO RELATED APPLICATIONS

This application is a continuation of U.S. patent application Ser. No. 08/786,127, filed Jan. 17, 1997.

BACKGROUND OF THE INVENTION

1. Field of the Invention

The present invention relates to a frequency discriminator that cooperates with an arrangement for measuring the frequency of an applied RF signal. More particularly, the present invention relates to a frequency discriminator cooperating with an arrangement that substantially eliminates frequency measurement delay errors typically caused by temperature variations in a delay line used to measure the frequency of the applied signal. Specifically, the present invention relates to an arrangement that measures the resistance of the delay line carrying the RF signal being measured and uses the measured resistance to compensate for the temperature variations of the delay line that would otherwise degrade the accuracy of the frequency measurement.

2. Description of the Prior Art

RF radio receivers that measures the frequency of an applied RF signal commonly employ a frequency discriminator. These RF radio receivers are usually characterized as digital frequency discriminators (DFD), or instantaneous frequency measurement (IFM) receivers, both known in the art. These RF radio receivers employed for RF frequency measurements commonly use one or more correlators also known in the art. The RF radio receivers that utilize correlators serve well their intended purpose, but do suffer accuracy degradation due to temperature variations and such radio receivers may be further described with reference to FIGS. 1–6 illustrated herein.

FIG. 1 illustrates a prior art arrangement 10 of a RF radio receiver comprising a frequency discriminator 12 that receives a RF signal 14 having a radian frequency, $\omega$, and delivers an output signal 16 representative of a vernier or coarse measurement of the frequency characteristic of the applied RF signal 14.

The RF signal 14 is also applied to a correlator 18. The correlator 18 directs the RF signal into two paths, the first path being a reference path and the second path being a delay path provided by a delay device 20 whose characteristic provides for a path length difference between the delay and reference paths indicated by the parameter $\tau$ and measured in seconds. As is known in the art, the correlator 18 operates in a manner analogous to performing mathematical manipulations so as to produce one or more product signals comprising the RF signal delayed by the path provided by the delay device 20 times the RF signal that is directed down the reference path and does not encounter the delay device 20. These products are illustrated in FIG. 1 as signals 22 and 24, each of which contain the quantities $\omega$ and $\tau$. The signals 22 and 24 respectively representative of the phase shift encountered by the RF signal 14 directed down the reference path, and the phase shift encountered by the RF signal 14 directed down the delay path, more particularly, encountered by the delay device 20. The product signals 22 and 24 are provided as output voltages from the correlator 18 and respectively are representative of and proportional to the sine and cosine of the phase angle difference of the RF signal 14 as measured between the delay and reference paths of the correlator 18. The correlator 18 provides at least one of the product signals 22 and 24, but it is preferred that both product signals 22 and 24 be provided. The product signals 22 and 24 may be respectively represented as $\sin \omega\tau$ and $\cos \omega\tau$, as shown in FIG. 1.

The delay line 20 may be implemented by a coaxial cable, printed delay line or some other delay device, and by choosing the proper characteristic of the delay line path (as known in the art) a desired interrelationship between the RF input frequency of the RF signal 14 to a video output (to be described with reference to FIG. 9) can be achieved. Moreover, improved measurement resolutions and accuracy of the RF frequency may be provided (as known in the art) by the use of multiple correlators 18, to be further described hereinafter with reference to FIG. 5, arranged to perform mathematical manipulations which correspondingly provide for more accurate product output signals 22 and 24. However, in spite of further accuracy improvements for the product signals 22 and 24, the use of the delay line 20 degrades the accuracy of the RF frequency measurement.

The accuracy of the RF frequency measurement signal is a direct function of the accuracy of the RF delay line 20. The delay line 20 typically exhibits a repeatable error characteristic which is temperature dependent. To eliminate this temperature dependent error, a variety of approaches have been employed to compensate for changes in temperature and its attendant degradation of the accuracy of the frequency measurement and one such approach may be described with reference to FIG. 2.

FIG. 2 illustrates a prior art arrangement 26 which is quite similar to that of FIG. 1 with the exception that an oven 28 has been added thereto and in which is arranged the delay device 20. The delay device 20 is not subjected to any accuracy degrading temperature variations, because of the constant temperature provided by the oven 28. The arrangement 26 having the oven 28 serves well its intended purpose, but has the attended drawbacks of power consumption, the need of warm-up time to allow the temperature of the oven to stabilize before the operation of circuit arrangement 26 is initiated, and also the disadvantage of the unreliability of the oven 28. Furthermore, as previously mentioned, when employing multiple correlators, such as those of FIG. 5, to be further described hereinafter, placed into a parallel array and arranged in a fixed ratio, relative to each other and having typical values of 2:1; 3:1 or 4:1, all of the temperatures of all of the RF delay lines are usually not stabilized. When such is the case, the characteristics of the RF delay lines will differ between the oven stabilized lines and those that are not. This difference is accentuated over temperature, and can lead to temperature tracking errors and large errors in the output frequency data measurements. An arrangement that does not suffer the inherent oven drawbacks may be described with reference to FIG. 3.

FIG. 3 illustrates a prior art arrangement 30 which is similar to that of FIG. 1 except that the conventional delay line 20 of FIG. 1 is replaced with a relatively large (compared to delay line 20) coaxial delay line 32, known in the art, having a low temperature coefficient. The arrangement 30 substantially corrects the temperature variation degradation of the accuracy of measuring frequency without suffering the disadvantages of the oven 28 of FIG. 2, but it does suffer the disadvantages of a higher cost (relative to delay line 20 ) and also packaging problems because of its relatively large size. Furthermore, because the special low temperature coefficient coaxial cable delay lines 32 are, in general, factory assembled, it causes field maintenance problems. An arrangement that does not suffer the disadvantages of either FIGS. 1, 2 or 3 may be further described with reference to FIG. 4.

FIG. 4 illustrates a prior art arrangement 34 which has many of the features of FIGS. 1–3 including a frequency discriminator 12 that receives the RF input signal 14 and provides an analog output signal representative of the frequency of the RF signal which, for arrangement 34, is routed to an analog to digital converter 40. The analog to digital converter 40 provides a first digital signal 16A representative of data that corresponds to the coarse frequency of the RF signal 14 which is routed to a programmable memory device 42. The programmable memory device 42, to be further described hereinafter with reference to FIG. 6, may be a conventional processor that is responsive to a program that causes the programmable memory device 42 to operate in a predetermined manner to combine digital signals. FIG. 4 further illustrates the arrangement 34 as having an analog to digital converter 44 which receives the product signals 22 and 24 and converts them into respective digital data which are routed to the programmable memory device 42. The τ quantity of the product signals 22 and 24 sine ωτ and cosine ωτ, respectively, is produced by a delay line 46.

The delay line 46 may be either a coaxial cable, a printed delay line, or another equivalent device, all known in the art, which cooperates with a temperature sensitive resistor 48 that is thermally coupled to the delay line 46 by means of a thermally conductive compound 50, all known in the art. The temperature sensitive resistor 48 has its first end connected to a first end of resistor RT1 which has its second end connected to ground and, further, the temperature sensitive resistor 48 has its second end connected to a first end of resistor RT2 which has its second end connected to a voltage reference 53. The temperature sensitive resistor 48 develops a voltage thereacross that is applied to an operational amplifier 52, by means of signal paths 54 and 56. The operational amplifier 52 amplifies the received signal and develops an output voltage, sometimes referred to as a video temperature voltage, which is applied to an analog to digital converter 52A. The analog to digital converter 52A provides a second digital signal representative of the temperature being sensed by the delay line 46.

The programmable memory device 42 serves as a combiner to combine the data generated by the analog to digital converter 52A, serving as temperature dependent additive factor, with the data contained in signal 16A (coarse frequency data) so as to provide frequency and temperature dependent data to produce an accurate measurement signal 60 of the frequency of the RF signal 14 that is compensated for temperature errors. The arrangement 34 of FIG. 4 may be further described with reference to FIGS. 5 and 6 associated with digital frequency discriminators (DFD) and with FIG. 5 illustrating a general arrangement 36A and FIG. 6 illustrating an arrangement 38B showing some of the essential details of FIG. 5.

FIG. 5 illustrates the arrangement 36A as comprising seven correlators, indicated as 18A, 18B, . . . 18F and 18G, with correlator 18G having the parallel temperature sensing resistor 48 indirectly coupled to the longest RF device line, that is, the delay line of the correlator 18G. The correlators 18A, 18B, 18F and 18G receive their RF signal 14 from a power divider 38 that receives the incoming RF signal 14. Each of the correlators 18A, 18B, . . . 18F and 18G produces the product signals 22 and 24 (sin ωτ and cos ωτ) which are routed to the arrangement 36B of FIG. 6.

FIG. 6 illustrates the programmable memory device 42 as comprised of elements 42A (TTL comparators and latches), 42B (error correction prom), 42C (temperature correction prom), 42D (output data latch), and 42E (phase split prom). FIG. 6 further illustrates amplifier 44A and 44B that respectively receive the sin ωτ and cos ωτ quantities of the seventh correlator 18G.

The differential sine (sin ωτ) and cosine (cos ωτ) video outputs from correlators 18A through 18F are provided to TTL comparators and latches 42A. This provides a 12-bit address input to the error correction prom 42B. In parallel, the sine (sin ωτ) and cosine (cos ωτ) video from the seventh (and longest delay) correlator 18G is amplified by video amplifiers 44A and 44B and are provided to ADC (Analog to Digital Converter) 44. The Most Significant Bit (MSB) of the digitized sine and cosine data (MSB S7 and MSB C7) of the ADC 44 respectively present on signal paths 44C and 44D are provided to the error correction prom 42B. This, when combined with the 12-bit data from correlators 18A through 18F, provides a 14-bit address to the error correction prom 42B. The error correction prom 42B is programmed with a mathematically generated error correction algorithm, known in the art, which produces an 8-bit error corrected raw coarse frequency data word on signal path 42F. This is the 8 MSB of frequency data prior to temperature correction.

With reference to the digitized sine and cosine data of correlator 18G, these two 6-bit data words are provided to the phase split prom 42E which, based on an analysis of the digitized sine and cosine video data, provides three outputs. More particularly, by using an arc-tangent algorithm, it provides the 5 LSB (Least Significant Bits) of a raw frequency data word indicated as signal path 42G. These 5-bits are attached to the 8-bit raw coarse frequency data word of signal path 42F to form the 13-bit raw frequency data word. In addition, the phase split prom 42E also generates a coherent threshold and data valid, which is an estimate of the utility of the data and which is indicated as signal path 42H.

In parallel, the temperature video, from the temperature sensor attached to the RF delay line, is digitized, forming a 5-bit temperature data word indicated as signal path 42I. This data is combined by the temperature correction prom 42C with the 13-bit raw frequency data word to generate a±correction which is added to the 13-bit raw frequency data word, to produce a 12-bit corrected frequency data word on signal path 42J which is routed to the output data latch the output of which is signal 60 of FIG. 4. The reason for the reduction from 13-bits to 12-bits is that it is desired to correct for temperature at half the frequency resolution so as to avoid dealing with the temperature boundaries at the digital output.

It should be noted that the actual technique for combining the temperature data with the raw frequency data is to form a 13-bit address for a temperature correction prom 42C, using the 8 MSB of frequency data and the 5-bits of temperature data. This prom 42C output is a±sign bit, plus 7-bit correction data, with the LSB of this data at half the output frequency resolution. This 7-bit data word is added to (or subtracted from, depending on the±sign bit) the 13-bit raw frequency data word in a binary full adder circuit. At the output of the adder circuit, the LSB is ignored, to produce the 12-bit frequency data output on signal path 42J.

While the arrangement 34 of FIG. 4 provides for accurate measured RF frequency data that serves an intended purpose, especially for static temperatures, there is a drawback with the arrangement 34 with regard to dynamic temperature changes. More particularly, in the arrangement 34 there is a time lag for sensing the changes in the temperature that the temperature resistor 48 is subjected to relative to the temperature of the delay device 46. This time lag is created by imperfections of the compound 50 coupling the temperature sensitive resistor 48 to the delay device 46. This time lag produces an error associated with the temperature sensitive resistor 48 and the delay device 46, especially at different temperatures. This time lag effect is particularly noticeable when the RF radio receivers of FIG. 4 are employed in high performance aircraft, where the temperature of the environment in which the RF radio receivers need to operate may change more than 50° C. in less than 5 minutes.

It is desired that an arrangement for measuring the frequency of an applied RF signal be provided that is substantially free from temperatures variations that might otherwise degrade the accuracy of the frequency measurement.

Accordingly, it is a primary object of the present invention to provide for an arrangement for measuring the frequency of an applied RF signal whose accuracy is not degraded by changes in temperature. More particularly, it is of prime importance to the present invention to directly measure the temperature of the delay line carrying the RF signal without the use of indirect device such as sensing resistor connected across the delay line of the correlator and use that measurement to directly compensate for any temperature changes that might otherwise degrade the accuracy of the measurement of the frequency of the applied RF signal.

It is a further object of the present invention to provide a correlator and associated circuitry used in frequency measurements that compensate for temperature variations.

Further still, it is an object of the present invention to provide circuitry used in the reference or delay line path of a correlator that compensates for temperatures variations therein.

Still further, it is an object of the present invention to provide for an arrangement that receives an applied RF signal, digitizes the applied signal, and provides a digitized output signal representative of an accurate frequency measurement of the applied RF signal.

It is another object of the present invention to provide for an arrangement that measures the resistance of the delay path of the correlator and uses that resistance measurement to provide for a signal that is used to compensate for temperature variations.

In addition, it is an object of the present invention to provide for a coaxial delay line in which the resistance of the center conductor and/or the outer shield is measured to provide for a signal that compensates for the temperature variations to which a correlator is subjected.

SUMMARY OF THE INVENTION

The present invention is directed to an apparatus for accurately measuring the frequency of an applied RF signal by measuring the resistance of a delay path through which the RF signal flows and then utilizing the resistance measurement to compensate for any temperature variations that the arrangement may be subjected to that might otherwise cause accuracy degradation to the frequency measurement.

The apparatus comprises a frequency discriminator, first and second analog to digital converters, a correlator, means for measuring resistance, detecting means, and a combiner. The frequency discriminator receives an applied RF signal and provides an analog output signal representative of the frequency of the RF signal. The first analog to digital converter receives the analog signal and provides a first digital representation thereof. The correlator receives and directs the RF signal into a delay path and a reference path. The correlator produces an output voltage representative of and proportionate to at least one of the sine and cosine of the phase angle difference of the RF signal as measured between the delay and reference paths. The measuring means is connected to one of the delay and reference paths and measures the corresponding resistance of one of the delay and reference paths and develops an output signal representative of the measured resistance. The detecting means receives the output signal of the measuring means, detects changes thereto, and develops an output signal representative of the changes thereof. The second analog to digital converter receives the output of the detecting means and provides a second digital signal representative thereof. The combiner receives the first and second digital signals and combines them into a composite signal representative of the frequency of the applied RF signal.

The attainment of the foregoing and related objects, advantages and features of the invention should be more readily apparent to those skilled in the art, after the review of the following detailed description of the invention taken in conjunction with the drawings in which:

DETAILED DESCRIPTION OF THE PREFERRED EMBODIMENTS

Figure 1:
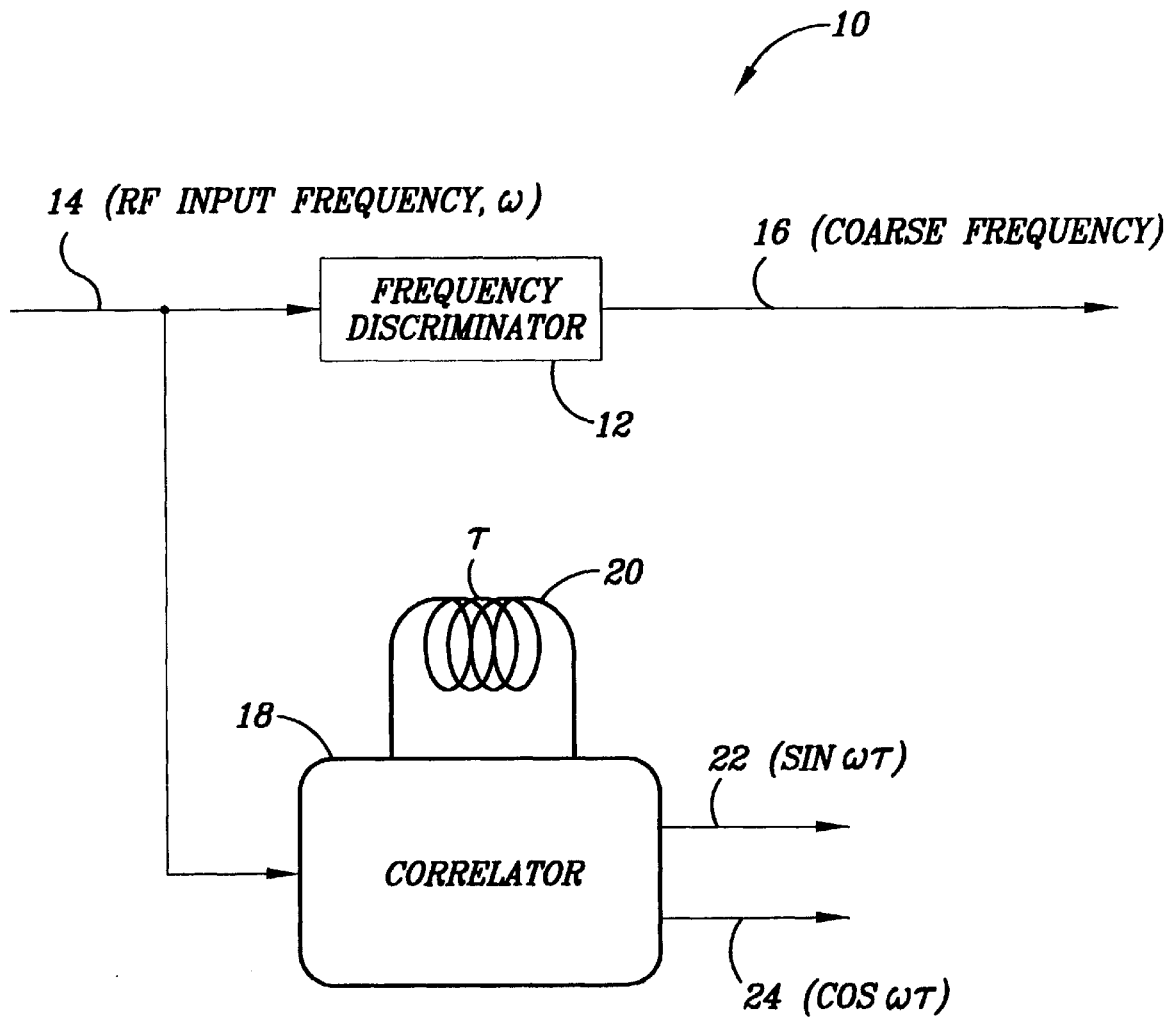
FIG. 1 is a block diagram of a prior art arrangement for measuring the frequency of an applied RF signal, but suffering from accuracy degradation due to the inability to compensate for temperature variations.
Figure 2:
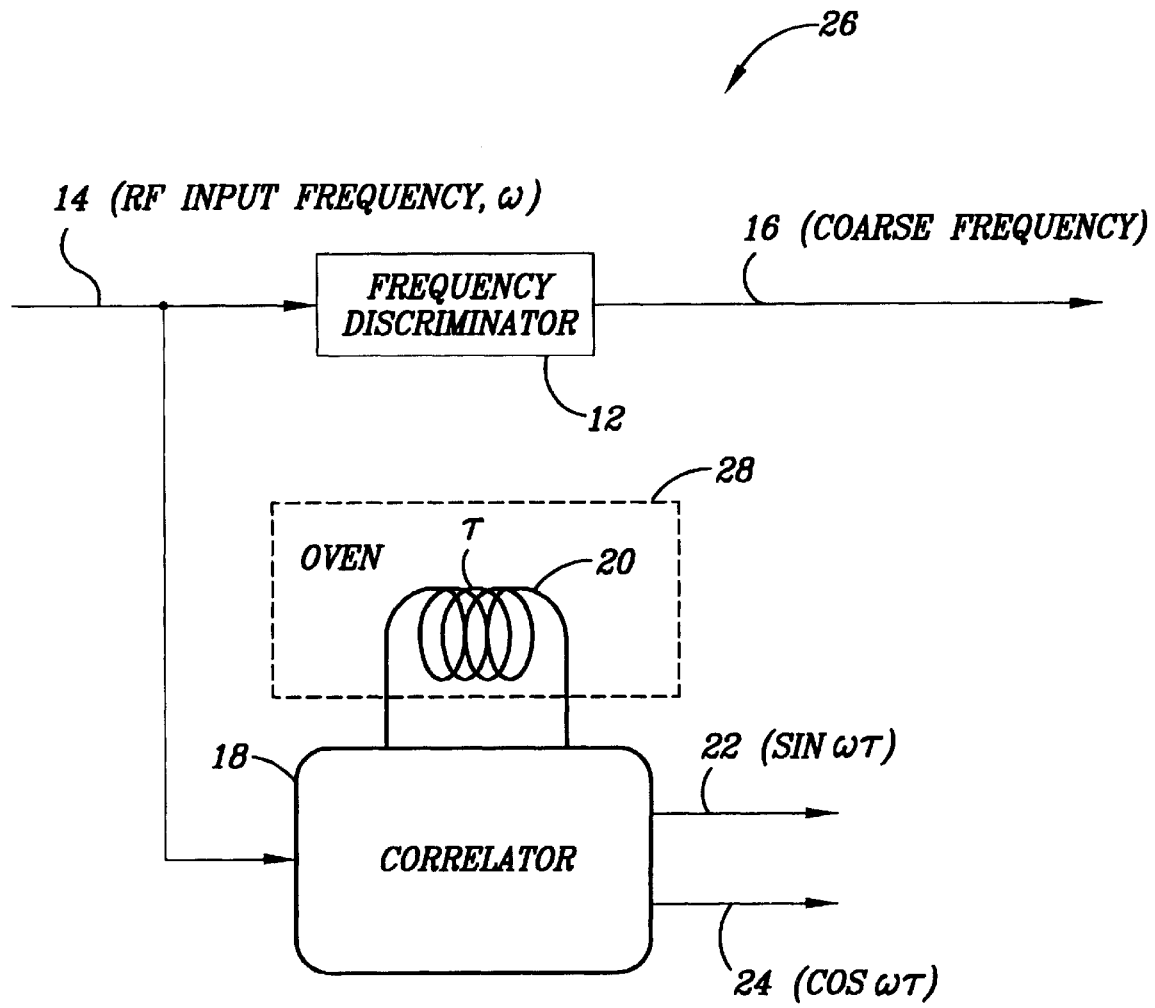
FIG. 2 is a block diagram of a prior art arrangement for measuring the frequency of an applied RF signal and utilizing an oven to compensate for temperature variations that might otherwise cause accuracy degradations.
Figure 3:
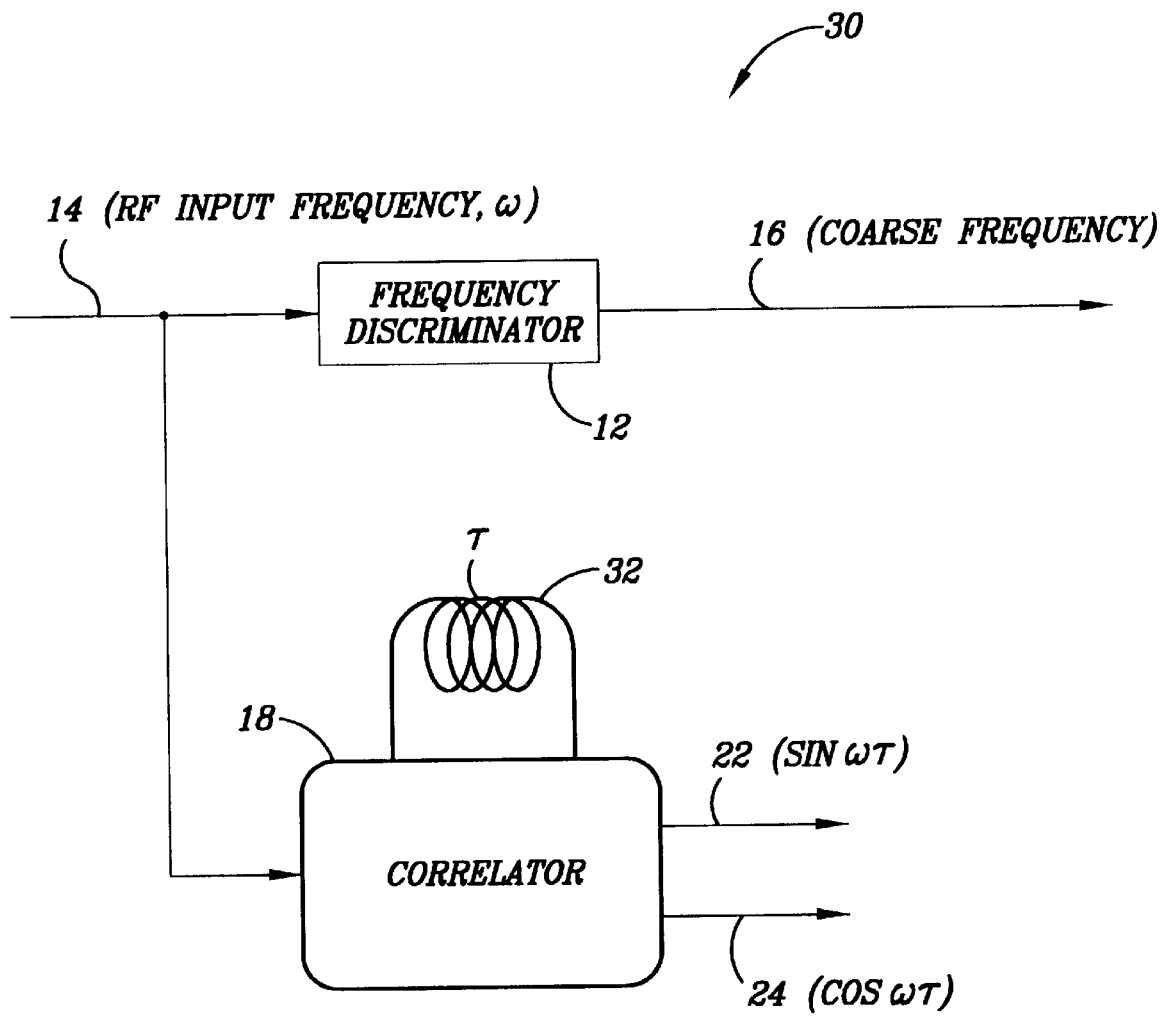
FIG. 3 is a block diagram of a prior art arrangement for measuring frequency of an applied RF signal that utilizes a low temperature coefficient delay line to substantially prevent temperature variations from degrading the frequency measurement.
Figure 4:
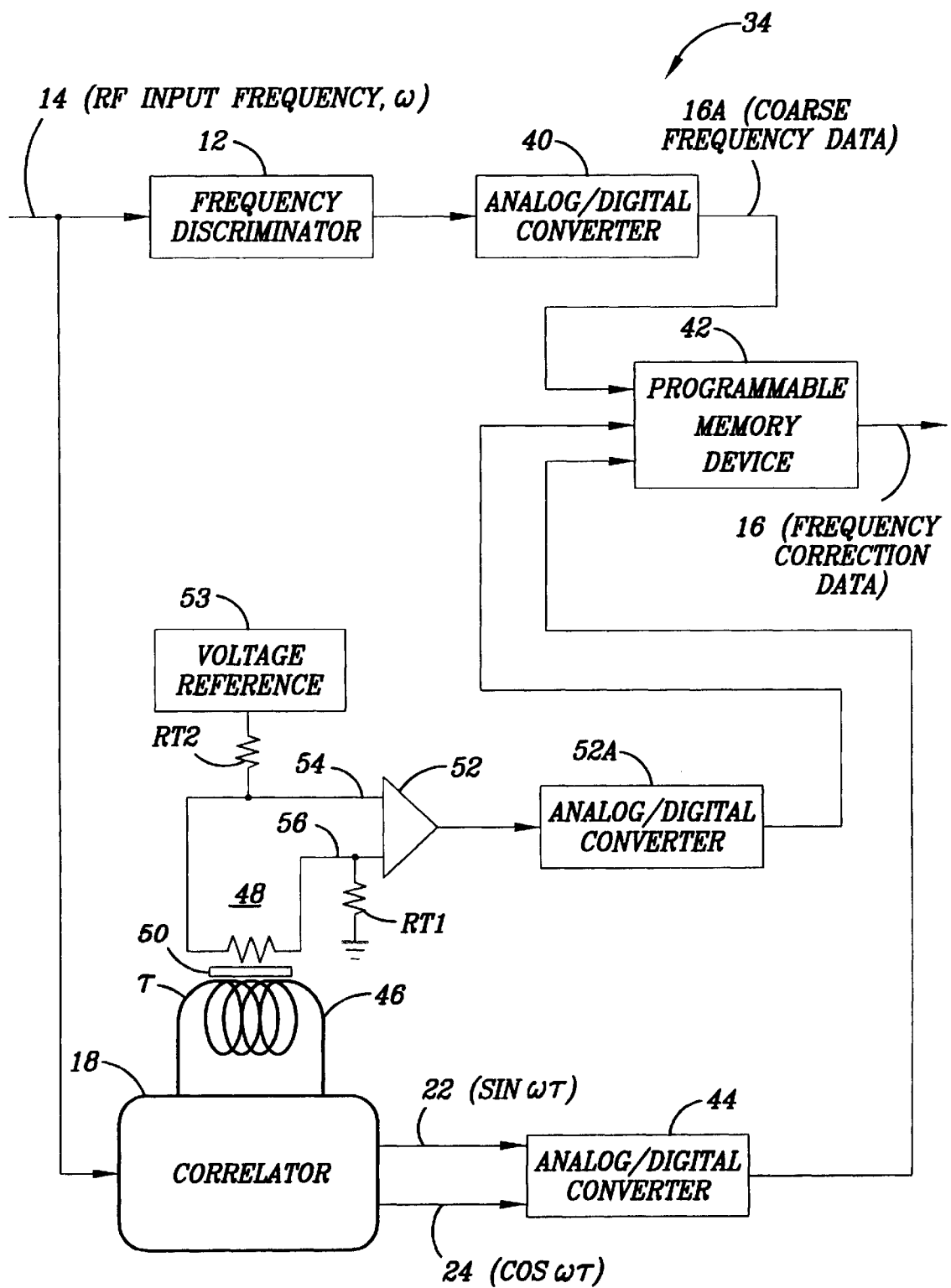
FIG. 4 is a block diagram of a prior art arrangement for measuring the frequency of an applied RF signal that utilizes a temperature sensitive resistor to serve as a sensor for indirectly sensing and compensating for temperature variations that might otherwise degrade the accuracy of the frequency measurement.
Figure 5:
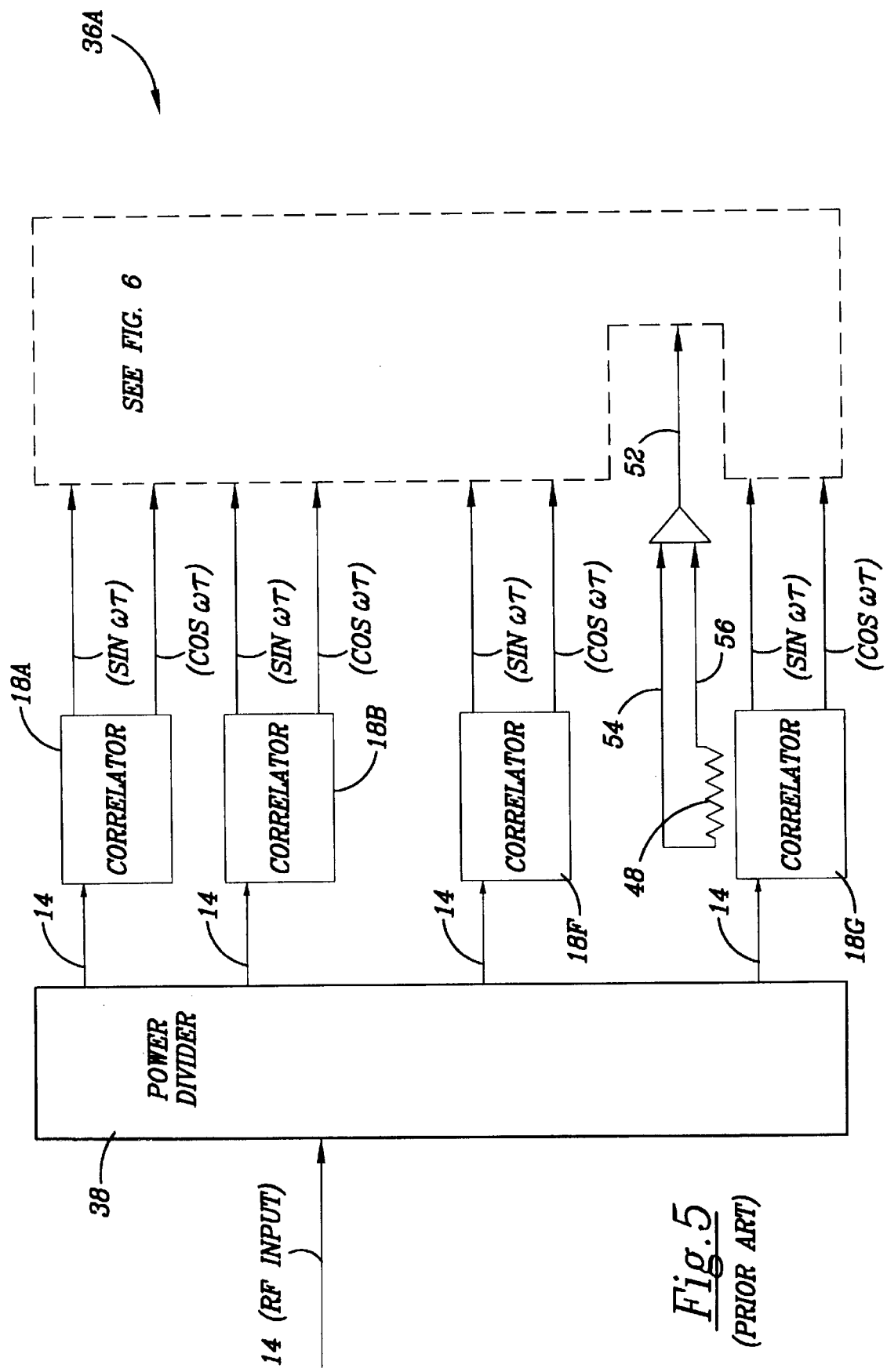
FIG. 5 is a block diagram of a prior art arrangement of a plurality of correlators used for frequency measurement.
Figure 6:
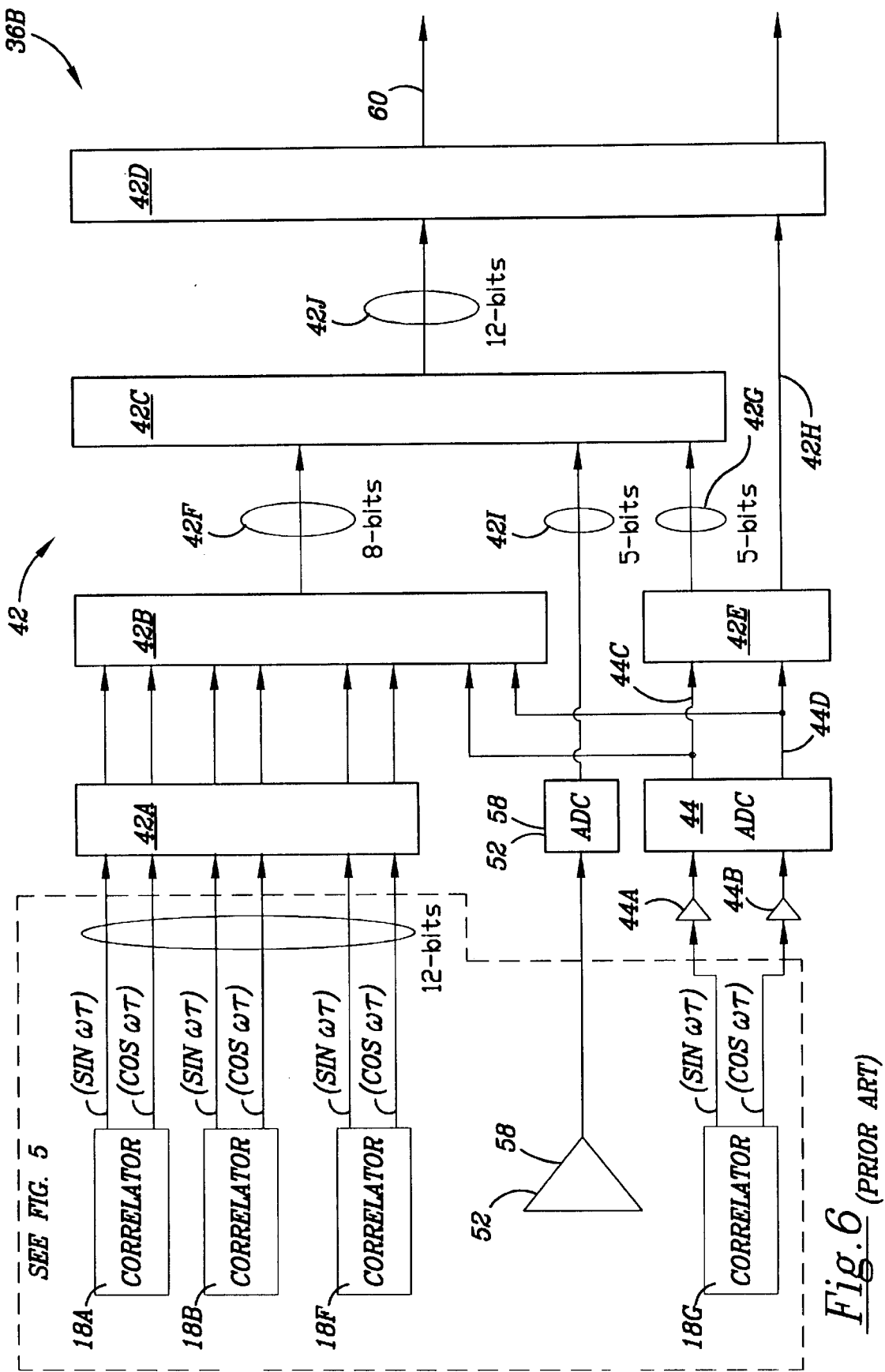
FIG. 6 is an arrangement showing further details of the prior art block diagram of FIG. 5.
Figure 7:
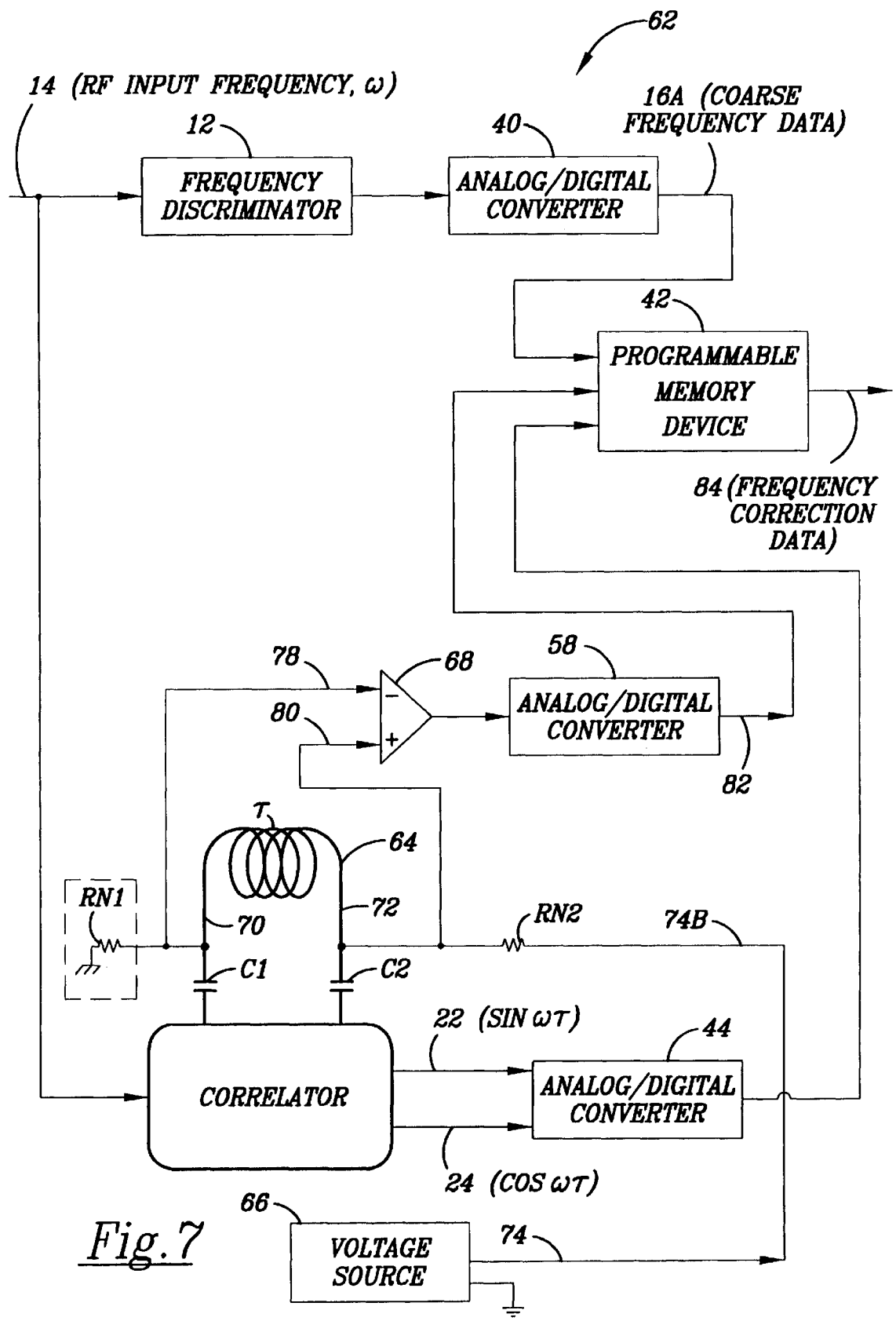
FIG. 7 is a block diagram of an arrangement of the present invention that measures the frequency of an applied RF signal and utilizes a circuit that directly measures the resistance of the delay path of the correlator to directly compensate for temperature variations that might otherwise degrade the accuracy of its measurements.

With reference to the drawings, wherein the same reference numbers indicate the same elements throughout, there is shown in FIG. 7 a circuit arrangement 62 that accurately measures the frequency of the applied RF signal 14, previously described with reference to FIGS. 1–6. The circuit arrangement 62 of FIG. 7 is similar to the circuit arrangement 34 of FIG. 4, with the exception of the associated circuitry (to be further described hereinafter) used in cooperation with either the reference or delay path of the correlator 18.

In general, the circuit arrangement 62 directly measures the resistance in the delay path that carries the RF signal 14, converts this resistance to a voltage (AC or DC), digitizes this voltage (AC or DC) into digital data, and uses the digital data to provide a compensation quantity for any variations in the RF signal 14 in the delay path that may have been caused by temperature changes. Although it is preferred that the resistance of the delay line associated with the correlator 18 be directly measured, the practice of this invention is also applicable to the direct measurement of resistance of the reference path of the correlator 18.

The elements of circuit arrangement 62 that have not been already described with reference to FIGS. 1–6 are given in Table 1.

TABLE 1

| REFERENCE NO. | ELEMENT |
| --- | --- |
| C1 | BLOCKING CAPACITOR |
| C2 | BLOCKING CAPACITOR |
| 64 | COAXIAL DELAY LINE |
| RN1 | FIRST RESISTOR NETWORK |
| RN2 | SECOND RESISTOR NETWORK |
| 66 | CONSTANT VOLTAGE SOURCE |
| 68 | OPERATIONAL AMPLIFIER |

A measuring means of the arrangement 62 comprising the first resistor network RN1, the second resistor network RN2, first and second blocking capacitors C1 and C2, and the voltage source 66 having first and second terminals. The measuring means is connected to the coaxial delay line 64. The values of C1 and C2 vary with the frequency band at which this invention is employed, but each of these blocking capacitors C1 and C2 is selected to have a value so as to provide extremely high DC resistance preferably in excess of 1 megohm and a capacitive reactance preferably less than 5 ohms. The coaxial delay line 64 is preferably a coaxial type with a semi-rigid center conductor having a typical diameter of 0.047 inches. The coaxial delay line 64 has a repeatable variation in its electrical delay length as a function of temperature. The center conductor of the coaxial delay line 64 also has a repeatable variation of resistance as a function of temperature. The principles of the present invention utilize these repeatable variations to compensate for temperature changes in a manner as to be described.

A detecting means of the circuit arrangement 62 comprises the operational amplifier 68 that has an operative relationship with both the first resistor network RN1 and the second resistor network RN2 which are respectively connected to an entrance portion 70 and exit portion 72 of the coaxial delay line 64. The first and second networks RN1 and RN2 are preferably connected to the center conductor of the coaxial delay line 64. The second resistor network RN2 receives excitation from the constant voltage source 66 via branch 74B which is connected to the main conductor branch 74 connected to the constant voltage source 66.

The constant voltage source 66 has two terminals one of which is connected to branch 74 and the other of which is preferably connected to the ground potential, as shown in FIG. 7. The constant voltage source 66 may supply either AC or DC excitation with a typical voltage value of about 5V.

In operation, the constant voltage source 66 provides for the flow of a small current, typically in the range from 5 to 10 milliamperes, through resistor network RN2, the coaxial delay line 64, the resistor network RN1, and then to ground. The coaxial delay line 64 has a finite, but small resistance. The current passing through this resistance causes a voltage drop to appear between the entrance portion 70 and exit portion 72 of the coaxial delay line 64. The voltage between the entrance 70 and exit 72 is applied to the negative (−) and positive (+) inputs of operational amplifier 68 via signal paths 78 and 80 respectively. The operational amplifier 68 develops and supplies its output to the analog to digital converter 58 which, in turn, converts it to the digital representation 82 serving as temperature compensated data which is combined, by the programmable memory device 42, with the coarse frequency data 16A to generate frequency correction data 84 representative of frequency of the RF signal 14 and compensated for any errors that might otherwise be caused by temperature changes to the coaxial delay line 64.

The programmable memory device 42, previously described in detail with reference to FIG. 6, may be preprogrammed in a manner known in the art so that increases in the resistance of the coaxial delay line 64, manifested as corresponding increases in the temperature of the coaxial delay line 64, are used to decrease the measured frequency of the RF signal 14 as represented by the data 84. Other techniques may be used, and even devices other than a programmable memory device 42 may be used so long as the data 84 representing the frequency of the applied RF signal 14 is compensated for the temperature changes be sensed by the coaxial delay line 64.

Figure 8:
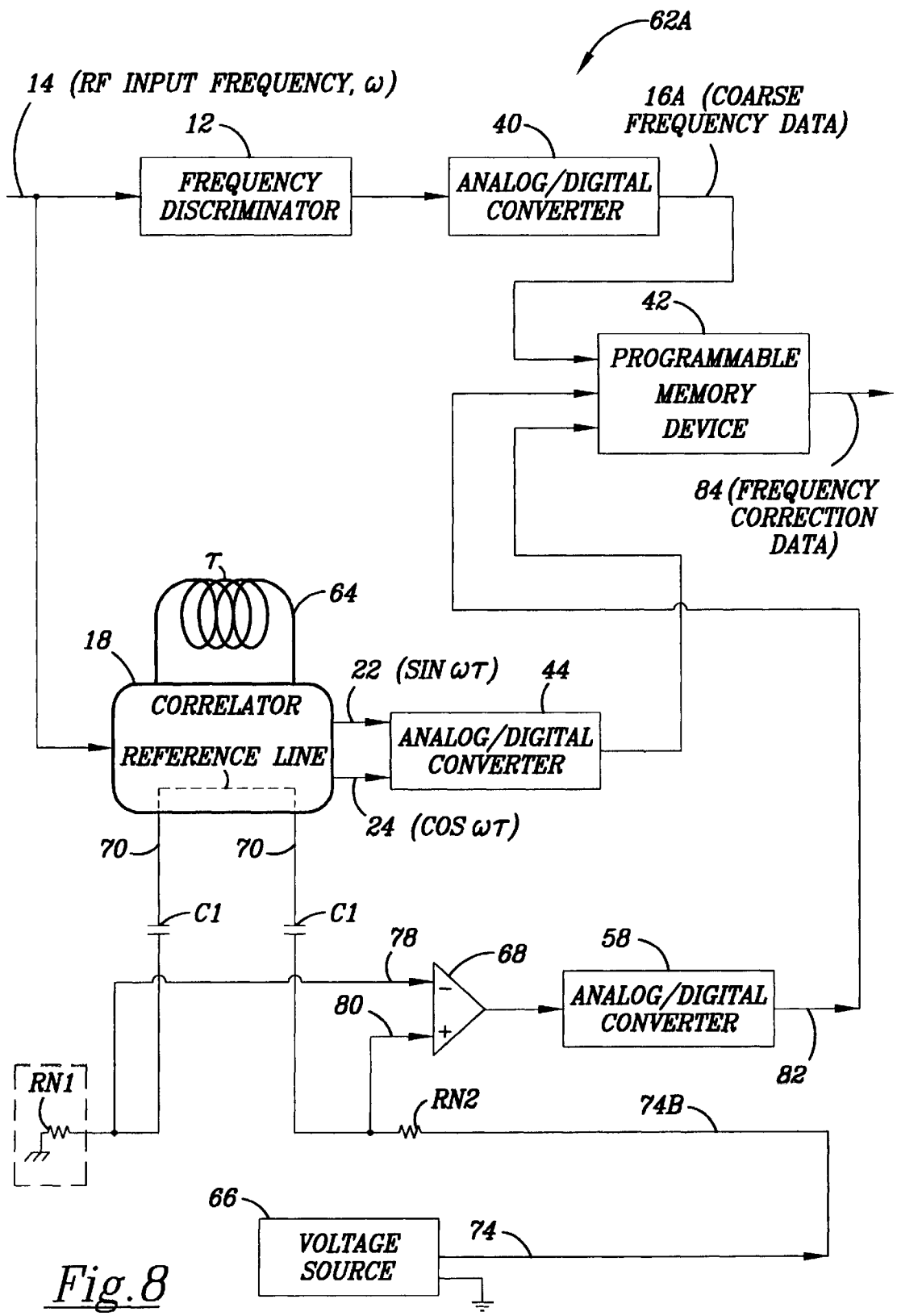
FIG. 8 is similar to the arrangement of FIG. 7, but has the measuring means directly attached to the reference path of the correlator.

Furthermore, the practice of the present invention is not limited to being based on the measurement of delay line 64, but rather may be practiced for any delay line, or any number of delay lines arranged in any predetermined array, or on any RF line such as the reference line of the correlator 18 as shown for arrangement 62A of FIG. 8.

The arrangement 62 A of FIG. 8 is the same as arrangement 62 of FIG. 7 except that the resistive networks RN1 and RN2, the voltage source 66, the operational amplifier 68 and the analog/digital converter 58 are directly applied to the reference line (shown in phantom) of the correlator 18. The interconnection of these elements of the arrangement 62A of FIG. 8 are the same as described for the arrangement 62 of FIG. 7.

In general, it is preferred that the application of the temperature sensing of the present invention be directly applied to the longest RF delay line only because this line, being the longest, has the highest resistance, and thereby is the easiest device to directly measure the change over temperature. The essential aspect of the present invention is that of directly measuring the actual delay line temperature; it matters not which delay line, as they are all assumed to be at the same temperature, even dynamically. It should be noted that unlike prior art devices, such as sensing resistors indirectly connected to a line to be measured, the present invention directly measures the line and, thus, is not burdened with the errors associated with the indirect device, such as those of the sensing resistor. The operation of the arrangements of FIGS. 7 and 8 may be further described with reference to FIG. 9 that gives further details related to the arrangement 62 although these details are equally applicable to arrangement 62A of FIG. 8.

Figure 9:
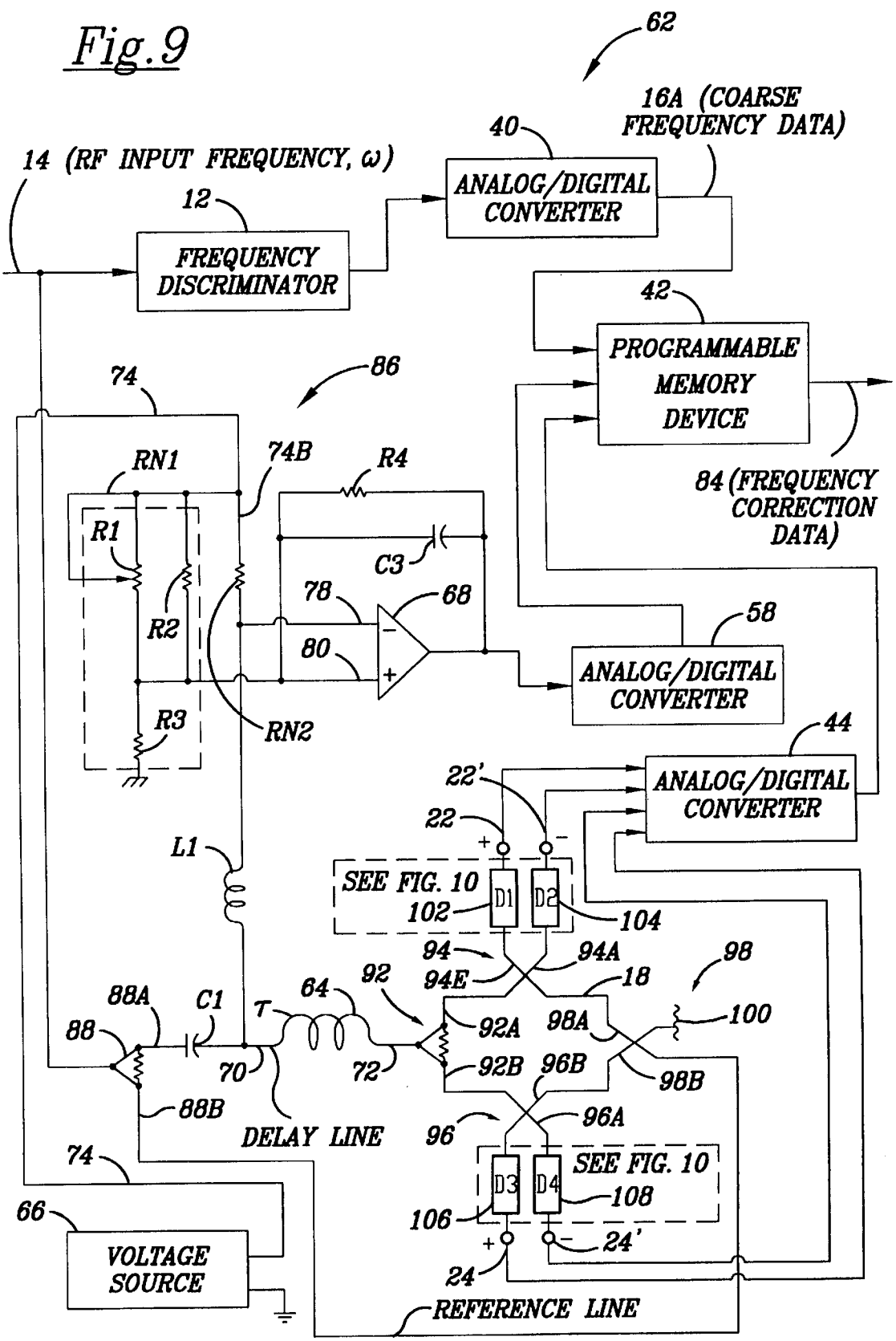
FIG. 9 illustrates further details of the arrangement of the present invention of FIG. 7.

FIG. 9 illustrates the first and second resistor networks RN1 and RN2 and the operational amplifier 68 and its associated components grouped into a circuit arrangement 86. As a comparison between FIGS. 7 and 9 reveals only the blocking capacitor C1, which is located on one side of the coaxial delay line 64, is illustrated in FIG. 9 and this is because the blocking capacitor C2 is not needed because of the grounding action of an inductor LF within detectors 102, 104, 106 and 108, to be described hereinafter with reference to FIG. 10, completes the DC circuit on the other side of the coaxial delay 64. The first resistor network RN1 comprises a potentiometer R1 having a typical value of 10 kΩ, a resistor R2 having a typical value of 2 kΩ, and a precision resistor R3 having a typical value of 1.5 Ω, whereas the second resistor network RN2 comprises a single resistor having a typical value of 1 kΩ. The operational amplifier 68 has a resistor R4 and a capacitor C3 arranged as shown to provide feedback between the output and the input stages of the operational amplifier 68 and having respective values of 300Ω and 0.1 microfarads.

The resistive network RN2 has one end connected to a first end of an inductor L1 which, in turn, has its second end connected to the entrance portion 70 of the coaxial delay line 64 and also to one end of a blocking capacitor C1 which, in turn, has its second end connected to a power coupler 88 which is actually a part of the correlator 18. The power coupler 88 has first and second ends 88A and 88B, with the line attached to end 88B serving as the reference line that is illustrated in phantom in FIG. 8. The inductor L1 may be a piece of bent wire with extremely low DC resistance preferably less than 0.5 ohms and preferably having an inductive reactance in excess of 500 ohms.

The arrangement 62 of FIG. 9 illustrates the correlator 18 as being a microwave correlator (known in the art) assembly made available from Wide Band Systems, Inc., of Franklin, N.J. and having first, second, third and fourth couplers 92, 94, 96 and 98 respectively. The first coupler 92 is arranged for receiving the RF signal 14 (not shown) after it has passed through the delay path provided by the coaxial delay device 64. The first coupler 92 has first and second ends 92A and 92B. The second coupler 94 has first and second ends 94A and 94B with the first end 94A arranged for receiving the signal present at the first end 92A of the first coupler 92.

The third coupler 96 has first and second ends 96A and 96B, with the first end 96A arranged for receiving the signal present at the second end 92B of the first coupler 92. The fourth coupler 98 has first and second ends 98A and 98B, with the first end 98A arranged for receiving the signal present at the second end 94B of the second coupler 94. The second end 98B of the fourth coupler 98 is arranged for receiving the signal that is present at the second end 96B of the third coupler 96 and is also connected to a terminating resistor 100, having a typical value of 75Ω.

The second end 94B and the first end 94A both of the coupler are respectively connected to detectors 102 and 104 and, similarly, the second end 96B and the first end 96A both of the third coupler 96 are respectively connected to detectors 106 and 108. All of the detectors 102, 104, 106 and 108 comprise an arrangement of a diode, an inductor and a capacitor that may be further described with reference to FIG. 10.

Figure 10:
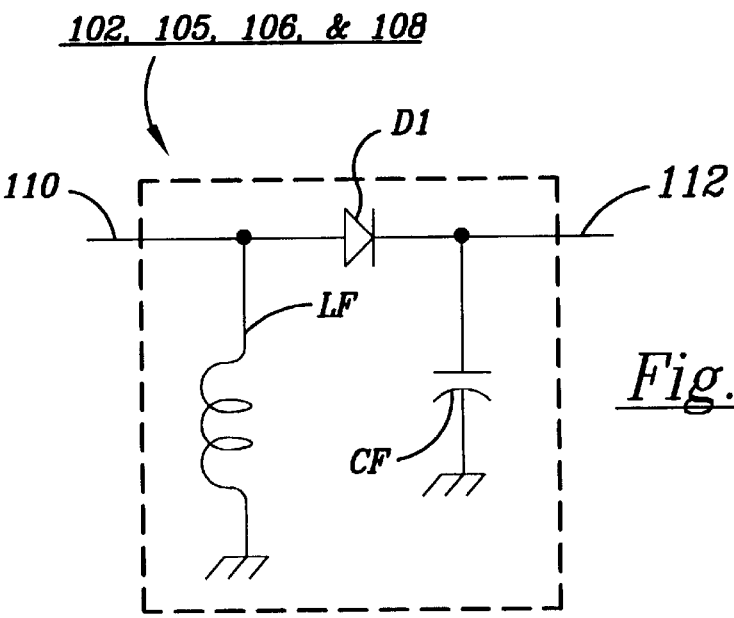
FIG. 10 illustrates a detector used in the circuit arrangement of FIG. 9.

FIG. 10 illustrates the detectors 102, 104, 106 and 108 as comprising a diode D1 having an anode and a cathode with the anode and cathode respectively serving as the input 110 and the output 112 connections of the detector. The detectors 102, 104, 106 and 108 further comprise an inductor LF with the first end connected to the anode of the diode D1 and the second end connected to the ground potential which is common to the ground of the constant voltage source 66. The detectors 102, 104, 106 and 108 still further comprise a capacitor CF with first and second ends, with the first end connected to the cathode of the diode D1 and the second end connected to the ground potential. The detectors 102, 104, 106 and 108 are commercially available from ACC, Inc., and in operation the inductors LF provide a DC path to ground with an inductive reactance greater than 500 ohms. The capacitors CF complete the RF circuit to ground, blocking DC to ground, and each has a capacitive reactance typically less than 5 ohms at the RF operating frequency at which this invention is practiced.

In operation, and with simultaneous reference to FIGS. 9 and 10, the operational amplifier 68 is arranged, as is shown in FIG. 9, to serve as a common DC resistance bridge which compares the resistance of the coaxial delay line 64 to that of the small precision resistor R3. The resistors R1 and R2 provide a small current to the precision resistor R3, whereas the second resistor network RN2 provides a similar small current through the choke L1, into the entrance portion 70 of the coaxial delay line 64, through the coaxial delay line 64, out to the exit portion 72 of the coaxial delay line 64, and then to the coupler 92 of the correlator 18. The correlator 18 is arranged so that the couplers 92, 94, 96 and 98 drive the detector modules 102, 104, 106 and 108. In FIG. 10 it should be noted that each of the detector modules 102, 104, 106 and 108 has an inductor LF connected to ground at the diode D1 input. The current originating through the second resistor network RN2 flows through the coaxial delay line 64 then to ground through the detectors 102, 104, 106 and 108. The output of detector 102 is the product signal 22 (cosine ωτ), whereas the output of the detector 104 is product signal 22' which serves as a differential video signal. The detectors 102 and 104 produce a differential cosine output, and, similarly, the detectors 106 and 108 produce a differential sine output. The differential video output is used to reduce the sensitivity of video circuits to extraneous noise pick-up. The output of the detector 106 is the product signal 24 (cosine ωτ), whereas the output of detector 108 is 24' which serves as a video signal. The product signals 22 and 24 as well as the video signals 22' and 24', are routed to the analog to digital converter 44 which provides a digital representation thereof that is routed to the programmable memory device 42.

In the overall operation of the circuit arrangement of FIG. 9, as the resistance of the coaxial delay line 64 varies with temperature, the DC voltage at the entrance 70 of the coaxial delay line 64 changes which, in turn, changes the voltage at the second end of the second resistor network RN2 which is also connected to the positive (+) input of the operational amplifier 68. The operational amplifier 68 amplifies this change and provides a corresponding increased voltage to the analog to digital converter 58 which, in turn, provides a corresponding increased digital representation of the temperature related quantity.

The RF signal 14 applied to the power divider 88 is unaffected by the changes sensed by the operational amplifier 68. More particularly, the RF signal 14 is passed through the DC blocking capacitor C1 and is isolated from the operational amplifier 68 by the choke L1. The RF signal 14 then continues (along with the small DC current) to the coaxial delay line 64 and is processed normally by the correlator 18.

It should now be appreciated that the practice of the present invention provides for an arrangement for accurately measuring the frequency of an applied RF signal and which accuracy is unaffected by the temperature changes that may affect the RF delay device.

It should be further appreciated that unlike prior art devices that utilizes devices, such as sensing resistors coupled to a delay line to indirectly measure temperature changes, a critical feature of the present invention is that it directly measures the temperature of the delay line without the need of sensing resistors and provides an accurate measurement thereof so that the frequency of the applied RF signal can correspondingly be accurately measured.

It should be further appreciated that the arrangement of FIGS. 7, 8 and 9 of the present invention accepts either an AC or DC excitation supplied by the constant voltage source 66 and operates correctly for each type of excitation.

Although the present invention describes the measurement of the resistance of the center conductor of the coaxial delay line 64, it should be recognized that the resistance of the outer shield or the combination of the resistance of the outer shield and that of the center conductor of the coaxial delay line 64 may be used. If the outer shield of the coaxial delay line 64 is used then means need to be provided so that the inductor L1 is connected to the outer shield of the coaxial delay line 64.

RESULTS YIELDED FROM THE PRACTICE OF THE PRESENT INVENTION

Figure 11:
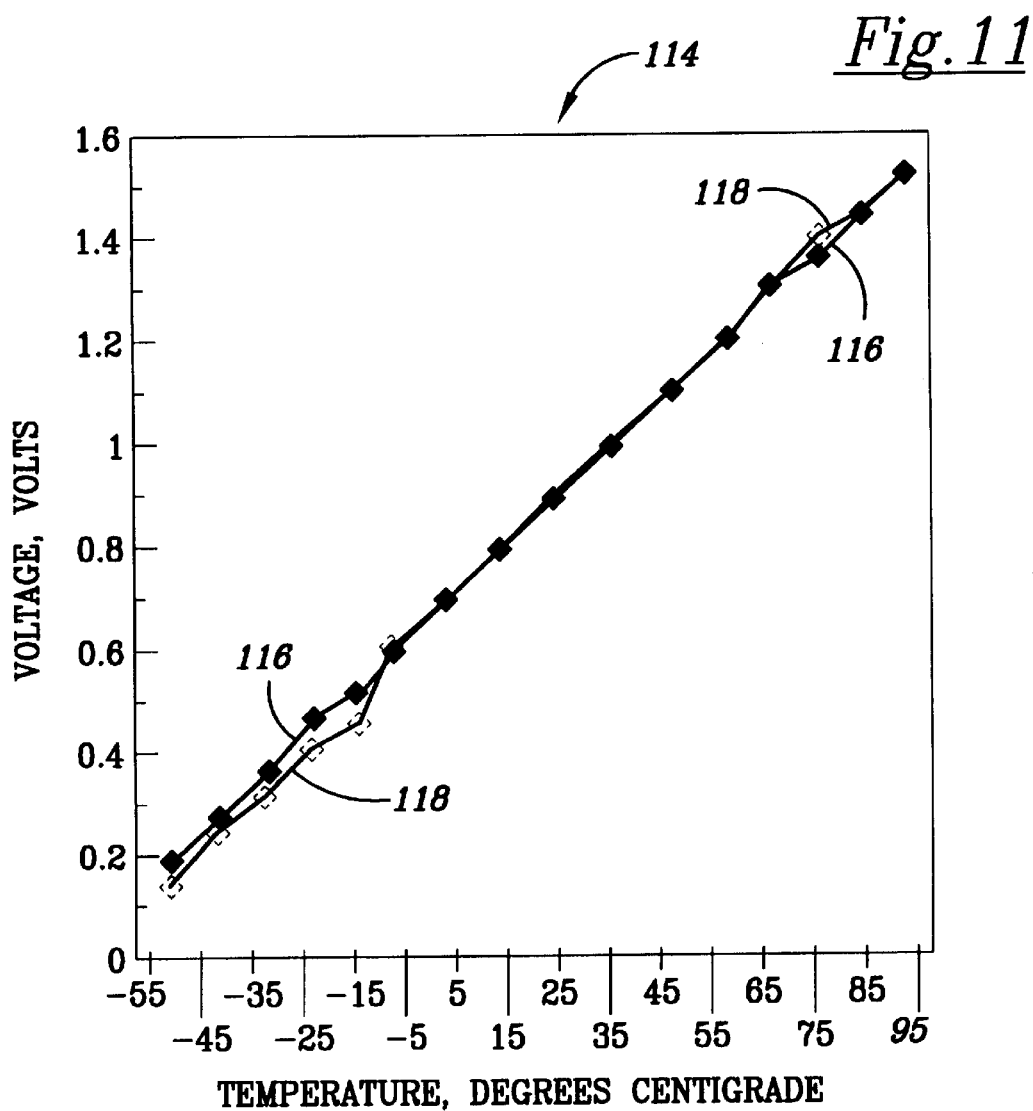
FIG. 11 illustrates the results of testing performed on the circuit arrangement of FIG. 9.

In the practice of the present invention tests were performed using the arrangement 62 of FIGS. 7, 9 and 10, and the results of which are illustrated in FIG. 11 for a response plot 114. FIG. 11 has a Y axis indicated in terms of the output voltage of the operational amplifier 68, and a X axis indicated in terms of temperature, and given in degrees centigrade (C). The output voltage indicated in the Y axis is representative of the difference in the voltage detected by the operational amplifier 68 as compared to the circuit arrangement of FIG. 2 that uses in an oven 28 to provide a constant temperature for the coaxial delay line. More particularly, the oven 28 provides a constant temperature for a coaxial delay line 64, whereas the response plot 114 of FIG. 11 represents the changes in the voltage (Y axis) sensed by the operational amplifier 68 as a coaxial delay line 64 experiences the temperatures and changes thereto (X axis).

The testing consisted of run one (plot 116) and run two (plot 118) which were made in two different temperature directions, with run one (plot 116) starting from cold and going to hot temperatures, and run two (plot 118) starting from hot and going to cold temperatures. Plot 116 is indicated with solid marker blocks, whereas plot 118 is partially indicated with marker blocks shown in phantom.

From FIG. 11 it is seen that run two, plot 118, had lower voltage values at the low temperature quantities compared to those of plot 116, whereas at high temperature values plot 118 has values that exceed those of plot 116. It is also seen from FIG. 11 that both plots 116 and 118 are substantially linear. It may be further seen from FIG. 11 that there is a slight gap between plots 116 and 118 at cold temperatures which is due to the error between the measured air temperature in the oven (28) and the actual coaxial delay line 64 temperature, which, of course, emphasize the difficulties encountered in measuring the actual delay device temperatures.

It should now be appreciated that the practice of the present invention provides for an arrangement that accurately measures the frequency of an applied RF signal in the microwave frequency range and provides such accuracy in spite of any temperature variations that the delay line of the correlator may experience.

While the invention has been described with reference to specific embodiments, this description is illustrated and is not to be construed as limiting the scope of the invention. Various modifications and changes may occur to those skilled in the art without departing from the spirit and scope of the invention as defined by the appended claims.

What we claim is:

1. A correlator comprising:
    a) means for receiving and directing an RF signal into both a delay path and a reference path and developing an output voltage representative of and proportional to at least one of the sine and cosine of the phase difference of the RF signal as measured between the delay and reference paths;
    b) resistance measuring means directly connected to one of the delay and reference paths for directly measuring the resistance of the corresponding delay and reference paths and developing an output signal representative of said directly measured resistance; and
    c) detecting means receiving the output signal of said direct resistance measuring means for detecting changes thereto and developing an output signal representative of the changes thereof.

2. The arrangement according to claim 1, wherein said resistance measuring means comprises:
    a) a two terminal voltage source;
    b) a coaxial delay line comprising a center conductor for carrying said RF signal and having entrance and exit portions with means for respectively receiving and conveying said RF signal;
    c) a first resistor network having first and second ends with the first end connected to said entrance portion and the second end connected to one terminal of said two terminal voltage source; and
    d) a second resistor network having first and second ends with the first end connected to said exit portion of said coaxial line and the second end connected to the other terminal of said voltage source.

3. The arrangement according to claim 2, wherein said detecting means is directly connected to receive said output signal representative of said directly measured resistance, said detecting means comprising:
    an amplifier having positive (+) and negative (−) terminal inputs respectively connected to the first ends of the first and second resistor networks and having means for developing said output signal of said detecting means representative of the difference between the voltage between its positive (+) and negative (−) terminals.

4. A method of measuring the temperature of a correlator having delay and reference paths so that temperature changes to the correlator does not degrade the measurement accuracy of the correlator, said method comprising the steps of;
    (a) connecting resistance measuring means directly to one of said reference and delay paths for directly measuring the resistance of said one of said reference and delay paths and developing an output signal representative of said directly measured resistance; and
    (b) directly connecting detecting means to receive the output signal of said direct resistance measuring means for detecting changes thereto and developing an output signal representative of the changes thereof.

5. The method according to claim 4, wherein said resistance measuring means comprises:
   a) a two terminal voltage source;
   b) a coaxial delay line comprising a center conductor for carrying a RF signal applied to said correlator and having entrance and exit portions with means for respectively receiving and conveying said RF signal;
   c) a first resistor network having first and second ends with the first end connected to said entrance portion and the second end connected to one terminal of said two terminal voltage source; and
   d) a second resistor network having first and second ends with the first end connected to said exit portion and the second end connected to the other terminal of said voltage source.

6. The method according to claim 5, wherein said detecting means comprises:
   an amplifier having positive (+) and negative (−) terminal inputs respectively connected to the first ends of the first and second resistor networks and having means for developing said output signal of said detecting means representative of the difference between the voltage between its positive (+) and negative (−) terminals.

* * * * *